(12) United States Patent
Nautiyal

(10) Patent No.: US 7,379,347 B1
(45) Date of Patent: May 27, 2008

(54) MEMORY DEVICE AND METHOD FOR PERFORMING WRITE OPERATIONS IN SUCH A MEMORY DEVICE

(75) Inventor: Vivek Nautiyal, Uttranchal (IN)

(73) Assignee: ARM Limited, Cambridge (GB)

( * ) Notice: Subject to any disclaimer, the term of this patent is extended or adjusted under 35 U.S.C. 154(b) by 1 day.

(21) Appl. No.: 11/606,357

(22) Filed: Nov. 30, 2006

(51) Int. Cl.
*G11C 7/10* (2006.01)

(52) U.S. Cl. .................. 365/189.01; 365/154; 365/63; 365/230.08

(58) Field of Classification Search ........... 365/189.01, 365/154, 63, 230.06, 230.08
See application file for complete search history.

(56) References Cited

U.S. PATENT DOCUMENTS 6,741,493 B1 * 5/2004 Christensen et al. ........ 365/154
7,035,132 B2 * 4/2006 Nautiyal et al. ............ 365/154

OTHER PUBLICATIONS

Yamaoka et al., "90-nm Process-Variation Adaptive Embedded SRAM Modules With Power-Line-Floating Write Technique", IEEE Journal of Solid-State Circuits, vol. 41, No. 3, Mar. 2006, pp. 705-711.

* cited by examiner

*Primary Examiner*—Son Dinh
*Assistant Examiner*—Toan Le
(74) *Attorney, Agent, or Firm*—Nixon & Vanderhyc P.C.

(57) ABSTRACT

A memory device and method of performing a write operation in such a memory device are provided. The memory device comprises a memory array having a plurality of memory cells, and a plurality of word lines and a plurality of bit lines via which the plurality of memory cells are accessed. Write driver circuitry is responsive to a write request to write data into at least one memory cell during a programming interval by altering voltage on at least one of the bit lines connected to that at least one memory cell while one of the word lines connected to the at least one memory cell is selected, to cause a value indicative of the data to be stored in the at least one memory cell. At a start of the programming interval the at least one bit line is at a first voltage, and the write driver circuitry comprises first coupling circuitry responsive to the write request to couple the at least one bit line to a second voltage to cause the voltage on that at least one bit line to transition towards the second voltage. The first and second voltages represent the operating voltages of the memory cells. Further, additional coupling circuitry is provided which is triggered at a predetermined time during the programming interval to cause the at least one bit line to transition beyond the second voltage towards a third voltage. It has been found that such an approach significantly improves the writeability of memory cells within a memory device arranged to operate at low supply voltages.

12 Claims, 8 Drawing Sheets

MEMORY DEVICE AND METHOD FOR PERFORMING WRITE OPERATIONS IN SUCH A MEMORY DEVICE

BACKGROUND OF THE INVENTION

1. Field of the Invention

The present invention relates to a memory device and method of performing write operations in such a memory device.

2. Description of the Prior Art

It is generally desirable to seek to reduce the power consumption of a data processing apparatus, and such a data processing apparatus often includes a memory device for storing the data used by the data processing apparatus. Power consumption is particularly an issue in hand held or mobile devices such as laptops, mobile phones, PDAs, etc, since the power consumption of such a device has a large impact on the battery life. One approach for seeking to reduce power consumption of a device is to lower the supply voltage used, since lowering the supply voltage reduces the power consumption by a square law. Hence, there are significant benefits in reducing the supply voltage to a device such as a system-on-chip (SoC). Often, SoC devices have large embedded memory devices such as SRAM devices, and the total capacity of the embedded SRAM devices is increasing. Therefore, the proportion of power consumption associated with the memory device is significant and will continue to increase as memory capacity increases.

Whilst lowering supply voltage can significantly reduce power consumption, it can cause problems, particularly in respect of the operation of memory devices. A significant barrier to achieving low voltage memory devices is the increase in process variation that occurs with process scaling. In particular, as the individual memory cells are made smaller and smaller, the device characteristics of the cells vary significantly due to dopant fluctuation and other effects. This causes stability problems within the individual memory cells, and this stability problem is aggravated at lower operating voltages. In particular, a reduction in the nominal supply voltage is accompanied by a reduction in device noise margins, making components more vulnerable to power supply noise. This noise consists of AC noise caused by the dynamic AC voltage fluctuation due to the frequency-dependent distributed parasitics inherent in power distribution systems, and DC noise caused by capacitive mismatch. Further, a DC voltage drop causes a reduction in the signal, and as a result of this DC voltage drop the signal to noise margin (SNM) reduces (because the value of the signal is reduced). The DC voltage drop is often referred to as the IR drop, according to Ohm's law $V=I \times R$, where R is the equivalent path DC resistance between the source location and the device location, and I is the average current the chip draws from the supply. Hence, the more embedded a particular memory device is within the SoC, the higher the IR drop will be, and hence the greater the noise, thereby further reducing the stability of the cells. In particular, such noise can cause the state stored in individual memory cells to flip and it is accordingly important to try and avoid this occurring. To provide resistance to noise, it is generally required to make some of the individual transistors making up each memory cell relatively large, since this can improve the cell's resilience to noise. However, when such transistors are made larger, it has a negative impact on the writeability of the cell, in that the write operation will typically take longer when larger cells are used.

In summary, it is desirable to reduce supply voltages to a memory device so as to reduce power consumption. However, as memory devices become smaller, there is an increase in process variation which causes a stability problem that is aggravated when using low supply voltages. In seeking to provide resilience to this stability problem, a side effect is that writeability tends to become compromised.

The Article "90-nm Process-Variation Adaptive Embedded SRAM Modules with Power-Line-Floating Write Technique", by M Yamaoka et al, IEEE Journal of Solid State Circuits, Volume 41, No. 3, March 2006, discusses the writeability problem, and describes a power-line-floating technique which improves the speed of the write operation under lower supply voltage. In accordance with the technique described therein, the power supply to an addressed memory cell is made to float when that memory cell is accessed for writing. Before the data flip that occurs during the write operation, write current flows through a load transistor and transfer transistor of the memory cell, as shown in FIG. 4($a$) of that article, and this write current decreases the supply voltage and enables the write margin to be improved. Whilst controlling the supply voltage in such a way improves the write margin, and hence increases write speed, it tends to decrease the data retention stability of the cell.

Further, a PMOS isolation transistor is provided to form the switch used to enable the supply voltage to enter a floating state during the write operation. In particular, the PMOS isolation transistor is turned off at the start of the write operation to cause the supply voltage to float. However, when a write operation is not being performed, the PMOS isolation transistor is turned on, and the PMOS on-resistance gives rise an IR drop associated with that component which thereby gives a lower effective supply voltage at the memory cell, thereby reducing the static noise margin and hence reducing the stability of the cell. Further, the slightly reduced effective supply voltage is likely to slow down the read operation.

As an additional issue, there is a limit on the number of cells that can share the same PMOS isolation transistor, as decided by the capacitance of the floating line. In particular, the more cells that the isolation transistor is shared with, the higher the capacitance on the floating line, and the less the performance improvement of the write operation. At some point, the capacitance will reach a point where no improvement in the speed of a write operation occurs. As a result, a significant number of such PMOS isolation transistors will be required, and this will have a significant impact on area, and hence the cost, of a device constructed in such a manner.

Accordingly, it would be desirable to develop an improved technique for improving writeability in memory devices arranged to operate at low supply voltages.

SUMMARY OF THE INVENTION

Viewed from a first aspect, the present invention provides a memory device comprising: a memory array comprising a plurality of memory cells; a plurality of word lines and a plurality of bit lines via which the plurality of memory cells are accessed; write driver circuitry responsive to a write request to write data into at least one memory cell during a programming interval by altering voltage on at least one of said bit lines connected to said at least one memory cell whilst one of said word lines connected to said at least one memory cell is selected, to cause a value indicative of the data to be stored in said at least one memory cell; at a start of the programming interval said at least one bit line being at a first voltage, and the write driver circuitry comprising first coupling circuitry responsive to the write request to couple said at least one bit line to a second voltage to cause the voltage on said at least one bit line to transition towards said second voltage, said first and second voltages representing the operating voltages of said memory cells; and said write driver circuitry further comprising additional coupling circuitry triggered at a predetermined time during said programming interval to cause said at least one bit line to transition beyond said second voltage towards a third voltage.

In accordance with the present invention, write driver circuitry is provided which has first coupling circuitry and additional coupling circuitry. In order to write data into at least one memory cell, the voltage on at least one of the bit lines connected to that at least one memory cell is altered to cause a value indicative of the data to be stored in that at least one memory cell. The first coupling circuitry responds to a write request by coupling that at least one bit line to a second voltage (initially that at least one bit line being at a first voltage), this causing the voltage on the at least one bit line to transition towards the second voltage. The first and second voltages represent the operating voltages of the memory cells. Additionally, at a predetermined time during the programming interval, the additional coupling circuitry is triggered to cause the at least one bit line to transition beyond the second voltage towards a third voltage. Such an approach has been found to significantly improve the speed of the write operation in a memory device operating under low supply voltages, but without impacting read operation and cell stability. In particular, the additional coupling circuitry added to give rise to the increase in write operation speed has no effect during the read operation, and since the supply voltage to the memory cells is unaffected by the provision of the additional coupling circuitry, there is no impact on cell stability resulting from the inclusion of the additional coupling circuitry.

It has also been found that in many embodiments the additional coupling circuitry can be provided in a manner which has little impact on the overall area of the memory device, and accordingly can have less of a cost impact when compared with the earlier-mentioned prior art technique.

The values of the first, second and third voltages can be varied dependent on embodiment. However, in one embodiment, the first voltage is a supply voltage for the memory device, the second voltage is a ground level voltage supplied to the memory device, and the third voltage is a negative voltage.

The additional coupling circuitry provided in memory devices according to embodiments of the present invention can take a variety of forms. In one embodiment, said additional coupling circuitry comprises a booster circuit connected between said first coupling circuitry and said second voltage, at the start of the programming interval the booster circuit connecting said first coupling circuitry to said second voltage, and at said predetermined time said booster circuit being triggered to isolate the first coupling circuitry from the second voltage, charge within the booster circuit causing the at least one bit line to transition beyond said second voltage towards said third voltage. Hence, such a mechanism provides a simple and affective technique for causing the at least one bit line to transition beyond the second voltage towards the third voltage, thereby improving writeability.

Whilst a separate booster circuit can be provided for each column of memory cells, in one embodiment the booster circuit is shared amongst bit lines associated with multiple columns of memory cells within the memory array. This reduces the impact of the booster circuit on the area of the memory device, thereby reducing the cost of the memory device.

The booster circuit can take a variety of forms. However, in one embodiment, the booster circuit comprises a transistor which is on at the start of the programming interval and is turned off at said predetermined time.

In an alternative embodiment, each of said bit lines comprises a metal wire, and said additional coupling circuitry comprises an additional wire associated with each bit line, each bit line and its associated additional wire being arranged with respect to each other so as to create a capacitance therebetween. At said predetermined time each additional wire associated with said at least one bit line is connected to said second voltage, said capacitance causing the at least one bit line to transition beyond said second voltage towards said third voltage. Again, additional coupling circuitry arranged in such a way has no effect on the read operation and stability of the cell. However, an additional wire is typically required in association with each bit line, and hence may give rise to a larger area cost than when employing the booster circuit embodiment.

In one embodiment, at the start of the programming interval, each additional wire associated with said at least one bit line is connected to said first voltage. In particular, in one embodiment, the additional wires are arranged to be precharged to the first voltage level, and only when the predetermined time is reached during the programming interval is each additional wire associated with the at least one bit line connected to the second voltage.

In one embodiment, a control signal issued to said first coupling circuitry is further routed to a buffer to cause the buffer to generate at said predetermined time the second voltage placed on said additional wire associated with said at least one bit line. In particular, in one embodiment, when the at least one bit line has transitioned to the second voltage, a control signal is issued to the first coupling circuitry to turn that circuitry off, and this signal is used to cause the buffer to transition the associated additional wire to the second voltage. At this time, the capacitance between the relevant bit line and its associated additional wire causes that bit line to transition beyond the second voltage towards the third voltage, thereby improving writeability.

The techniques of embodiments of the present invention may be beneficial in a wide variety of different memory devices. However, in one particular embodiment, each column of memory cells in the memory array is connected to a pair of bit lines, an example of a memory device employing such an approach being an SRAM memory. In accordance with such memory devices, the write driver circuitry is responsive to a write request to write data into said at least one memory cell by altering the voltage on one of the bit lines in the pair of bit lines associated with each of said at least one memory cell, to cause a value indicative of the data to be stored in said at least one memory cell.

In one such embodiment, said first coupling circuitry comprises a pair of transistors for each of said pair of bit lines, at the start of said programming interval one of said pair of transistors being turned on to cause one of the bit lines in said pair of bit lines associated with each of said at least one memory cell to transition towards said second voltage.

Viewed from a second aspect, the present invention provides a method of performing a write operation in a memory device comprising a memory array comprising a plurality of memory cells, and a plurality of word lines and a plurality of bit lines via which the plurality of memory cells are accessed, the method comprising the steps of: responsive to a write request, writing data into at least one memory cell during a programming interval by selecting one of said word lines connected to said at least one memory cell and altering voltage on at least one of said bit lines connected to said at least one memory cell to cause a value indicative of the data to be stored in said at least one memory cell, said writing step comprising the steps of: at a start of the programming interval said at least one bit line being at a first voltage, and responsive to the write request employing first coupling circuitry to couple said at least one bit line to a second voltage to cause the voltage on said at least one bit line to transition towards said second voltage, said first and second voltages representing the operating voltages of said memory cells; and at a predetermined time during said programming interval, employing additional coupling circuitry to cause said at least one bit line to transition beyond said second voltage towards a third voltage.

Viewed from a third aspect, the present invention provides a memory device comprising: memory array means comprising a plurality of memory cell means; a plurality of word line means and a plurality of bit line means via which the plurality of memory cell means are accessed; write driver means responsive to a write request for writing data into at least one memory cell means during a programming interval by altering voltage on at least one of said bit line means connected to said at least one memory cell means whilst one of said word line means connected to said at least one memory cell means is selected, to cause a value indicative of the data to be stored in said at least one memory cell means; at a start of the programming interval said at least one bit line means being at a first voltage, and the write driver means comprising first coupling means responsive to the write request for coupling said at least one bit line means to a second voltage to cause the voltage on said at least one bit line means to transition towards said second voltage, said first and second voltages representing the operating voltages of said memory cell means; and said write driver means further comprising additional coupling means triggered at a predetermined time during said programming interval for causing said at least one bit line means to transition beyond said second voltage towards a third voltage.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
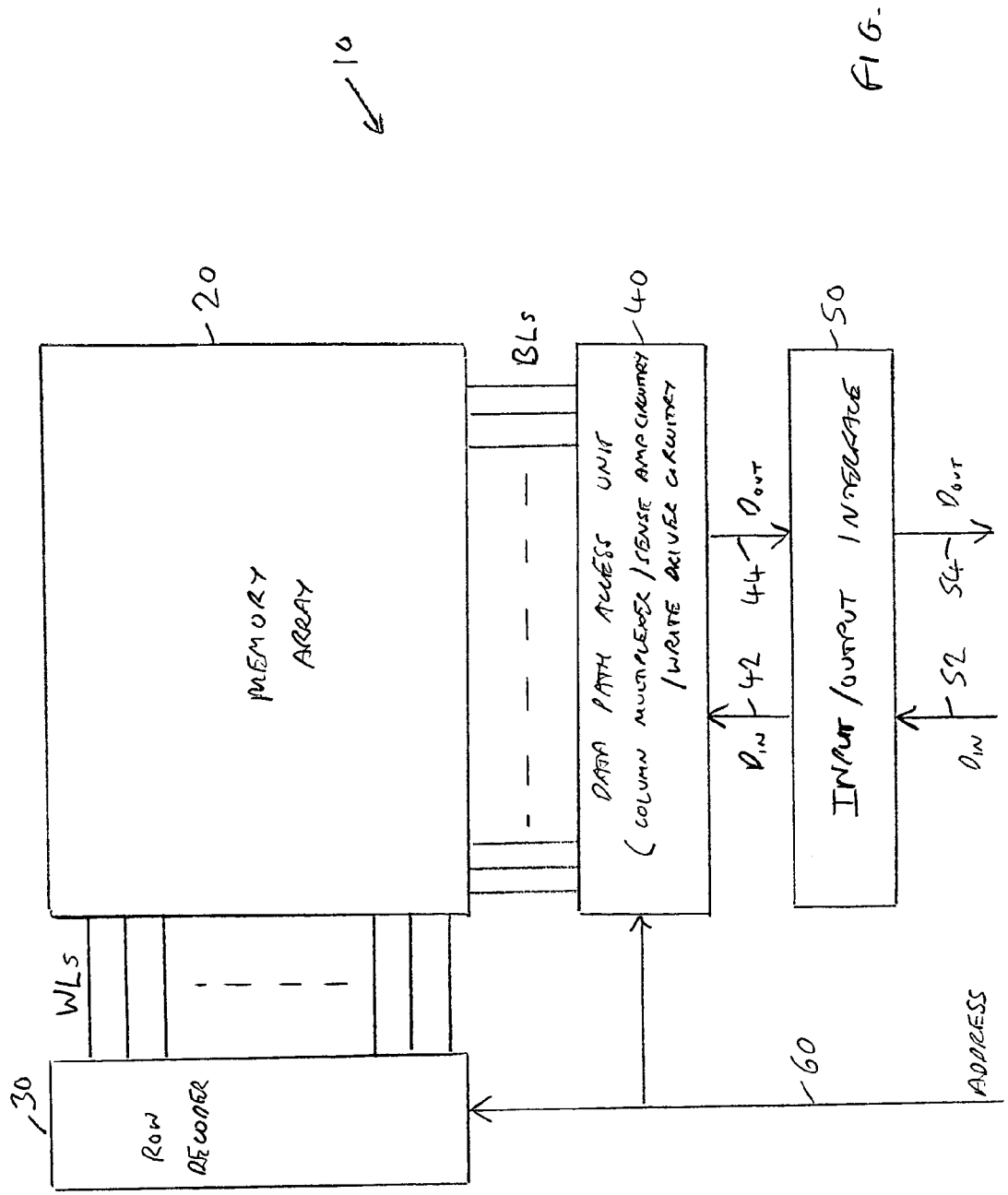
FIG. 1 is a diagram of a memory device incorporating write driver circuitry in accordance with one embodiment of the present invention.

FIG. 1 is a block diagram of a memory device 10 in accordance with one embodiment of the present invention. The memory device 10 has a memory array 20 consisting of a plurality of memory cells arranged in rows and columns. Each row has a word line (WL) connected thereto, and each column has at least one bit line (BL) connected thereto, the exact number of bit lines connected to each column being depending on embodiment. In one particular embodiment, the memory array consists of SRAM cells, and a pair of bit lines are connected to each column of cells.

When a memory access request is received, the address specified by the memory access request is routed over path 60 to a row decoder 30 and to a data path access unit 40. The row decoder 30 is arranged to decode the address and dependent thereon drive a control signal over one of the word lines in order to select one of the rows within the memory array 20. Similarly, the data path access unit 40 is arranged dependent on the address to identify the column or columns containing the data to be accessed, and to activate the respective bit lines.

For a read operation, such activation merely involves selecting the appropriate bit lines via a column multiplexer, and then using sense amp circuitry to observe variation on the voltage of the bit lines in order to determine the data stored in the addressed memory cell or memory cells. In particular, considering the earlier-mentioned SRAM example where a pair of bit lines are connected to each memory cell, these bit lines will initially be precharged to a supply voltage level, and when the relevant row of cells are selected via a drive signal on the relevant word line, one of the pair of bit lines connected to an addressed memory cell will start to discharge towards a ground voltage level, which of the bit lines in the pair discharges being dependent on the value stored therein. The discharging of one of the bit lines in the pair is sensed by the sense amp circuitry, which then produces an output signal over path 44 indicating the data stored in the addressed memory cell or memory cells. This output signal is then routed via the input/output interface 50 over path 54 to be returned as the read data to the source of the read access request.

For a write access request, the row decoder 30 operates in the same manner to select the relevant row by issuing a drive signal on the associated word line, and then write driver circuitry in the data path access unit 40 is used to alter the voltage on the relevant bit line or bit lines in order to cause the state held in the relevant memory cell or memory cells to be updated to reflect the data being written. Hence, the write data is routed over path 52 to the input/output interface 50 and from there over path 42 to the data path access unit 40. The write data will then be used to generate the appropriate control signals for the write driver circuitry to cause the voltage on one or more bit lines to be altered to cause the state of the addressed memory cell or memory cells to be updated. Hence, again considering the earlier-mentioned SRAM example, both of the bit lines associated with a particular column will initially be precharged, and dependent on the data to be written, one of the bit lines in the pair will be discharged by the write driver circuitry to cause the state in the addressed memory cell to be updated.

Figure 3:
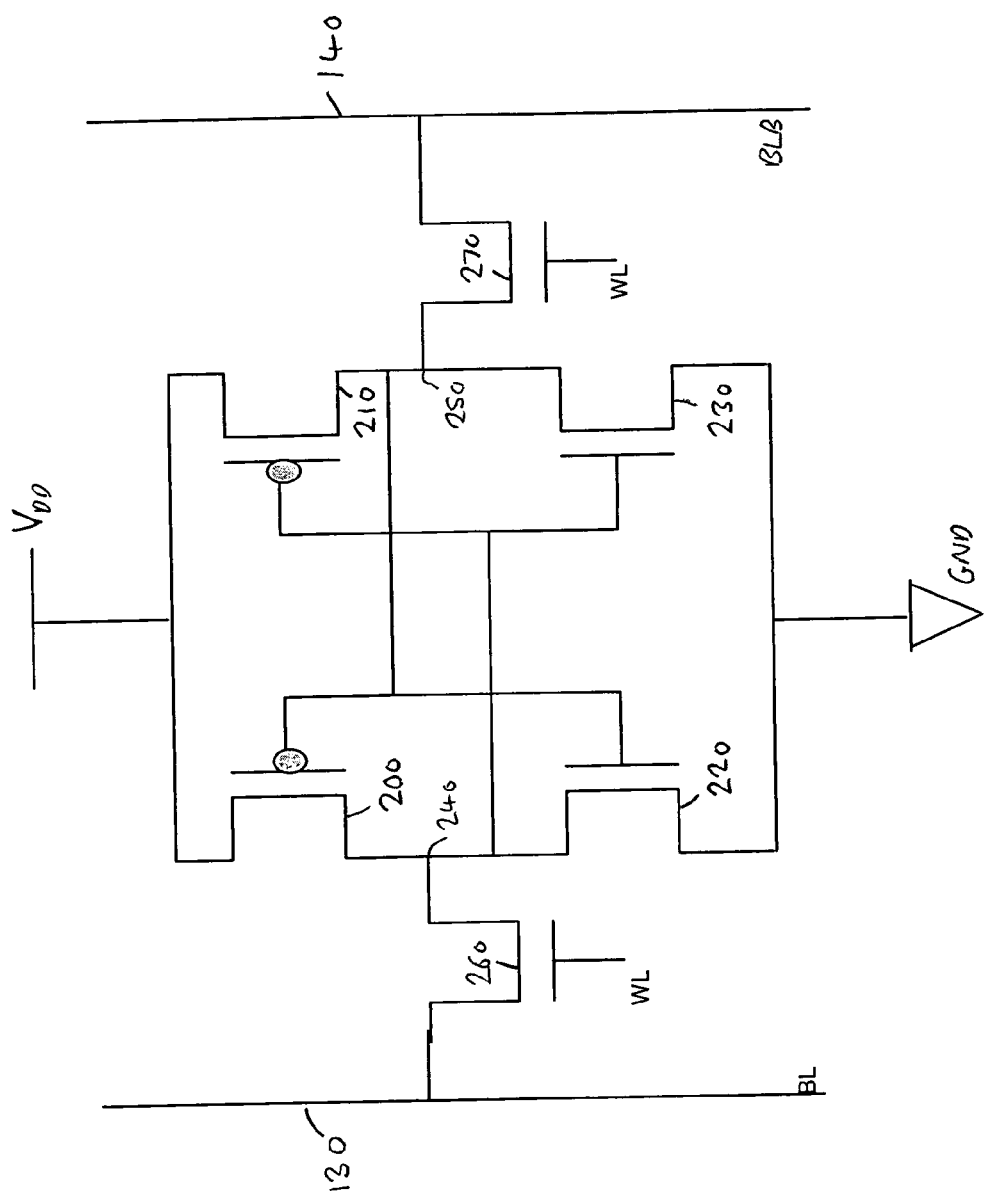
FIG. 3 is a diagram illustrating in more detail the construction of each memory cell shown in FIG. 2 in accordance with one embodiment of the present invention.

FIG. 3 is a diagram illustrating an example construction of a memory cell that may be used in an SRAM memory. As can be seen, the memory cell consists of two PMOS transistors 200, 210 and two NMOS transistors 220, 230. A node 240 is provided between the PMOS transistor 200 and the NMOS transistor 220, and similarly a node 250 is provided between the PMOS transistor 210 and the NMOS transistor 230. The bit line 130 is connected to the node 240 via an access transistor 260, and similarly the bit line 140 is connected to the node 250 via an access transistor 270.

Two different states can be stored within the memory cell shown in FIG. 3, a first state being where the node 240 is at a ground potential and the node 250 is at a supply potential $V_{DD}$, and the second state being a state where the node 240 is at the supply potential $V_{DD}$ and the node 250 is at the ground potential.

For a write operation to the cell shown in FIG. 3, the bit lines 130, 140 will initially be precharged to the supply voltage $V_{DD}$ and the access transistors 260, 270 will then be turned on by an appropriate word line control signal received at the gate of those transistors. Additionally, the write driver circuitry will start to discharge one of the bit lines towards the ground potential. During the programming interval, the state in the memory cell will either stay in its current state (because the memory cell already stores the data value required) or will flip state (because the desired value to be written into the memory cell is different to that represented by the current state). Considering the example where node 240 is initially at the $V_{DD}$ level and node 250 is at ground level, and then during the programming interval bit line 130 is discharged towards the ground potential, this will cause node 240 to be pulled towards the ground potential. However, initially the PMOS transistor 200 will be on due to the node 250 being at the ground level, and accordingly the PMOS transistor 200 has a tendency to pull the potential at node 240 up. Although the node 240 will ultimately discharge to the ground level, the counter effect of the PMOS transistor 200 slows the write process down. Ideally, the size of the PMOS transistor 200 would be kept relatively small to reduce this effect, but as mentioned earlier, when operating memory devices at low supply voltages, static noise gives rise to stability problems, and in order to combat those stability problems, the PMOS transistors 200, 210 are usually made relatively large, and this contributes to the adverse effect on writeability mentioned previously.

Figure 2:
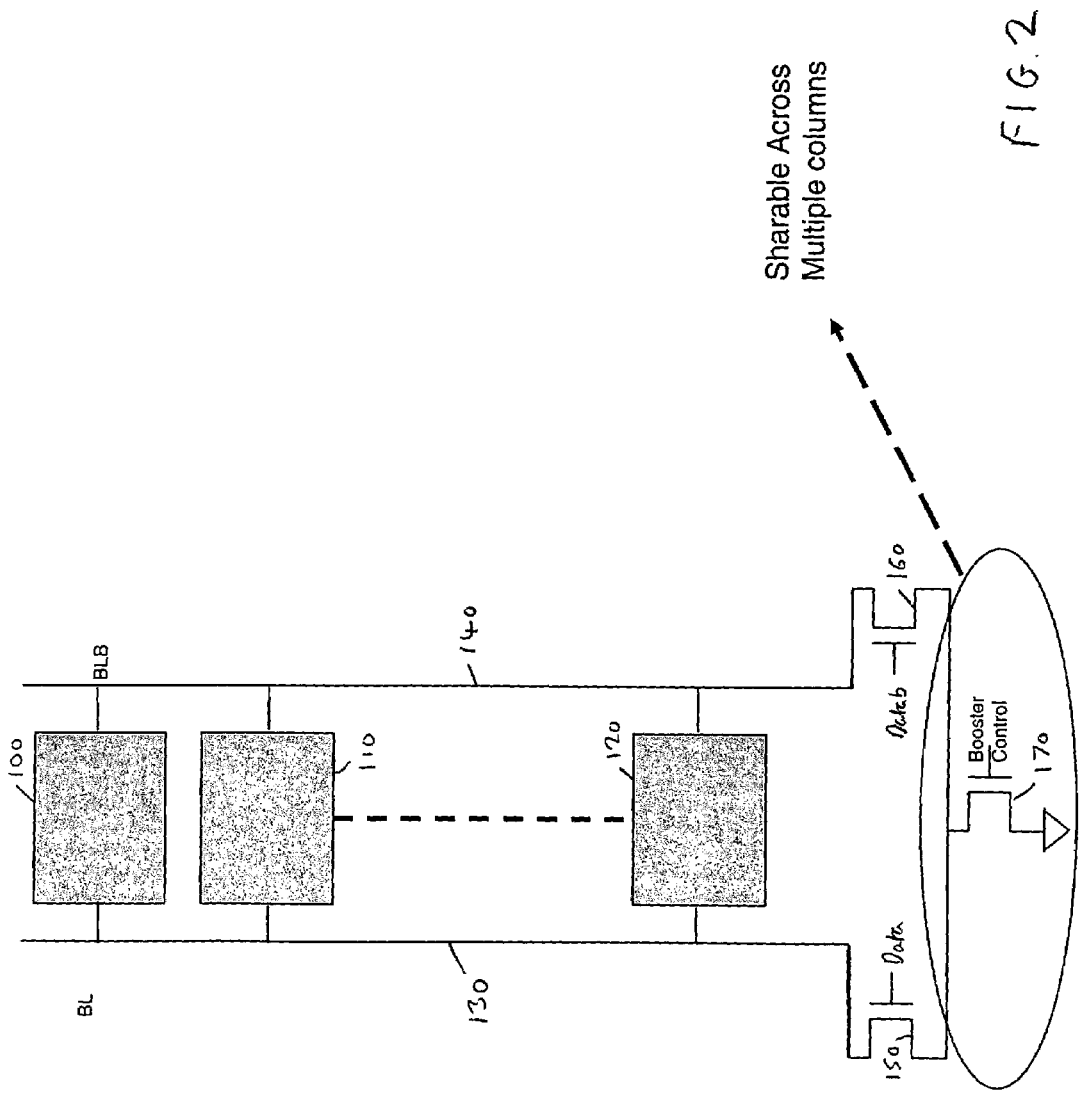
FIG. 2 is a diagram illustrating in more detail the write driver circuitry connected to a pair of bit lines within the memory array of the memory device in accordance with one embodiment of the present invention.
Figure 4:
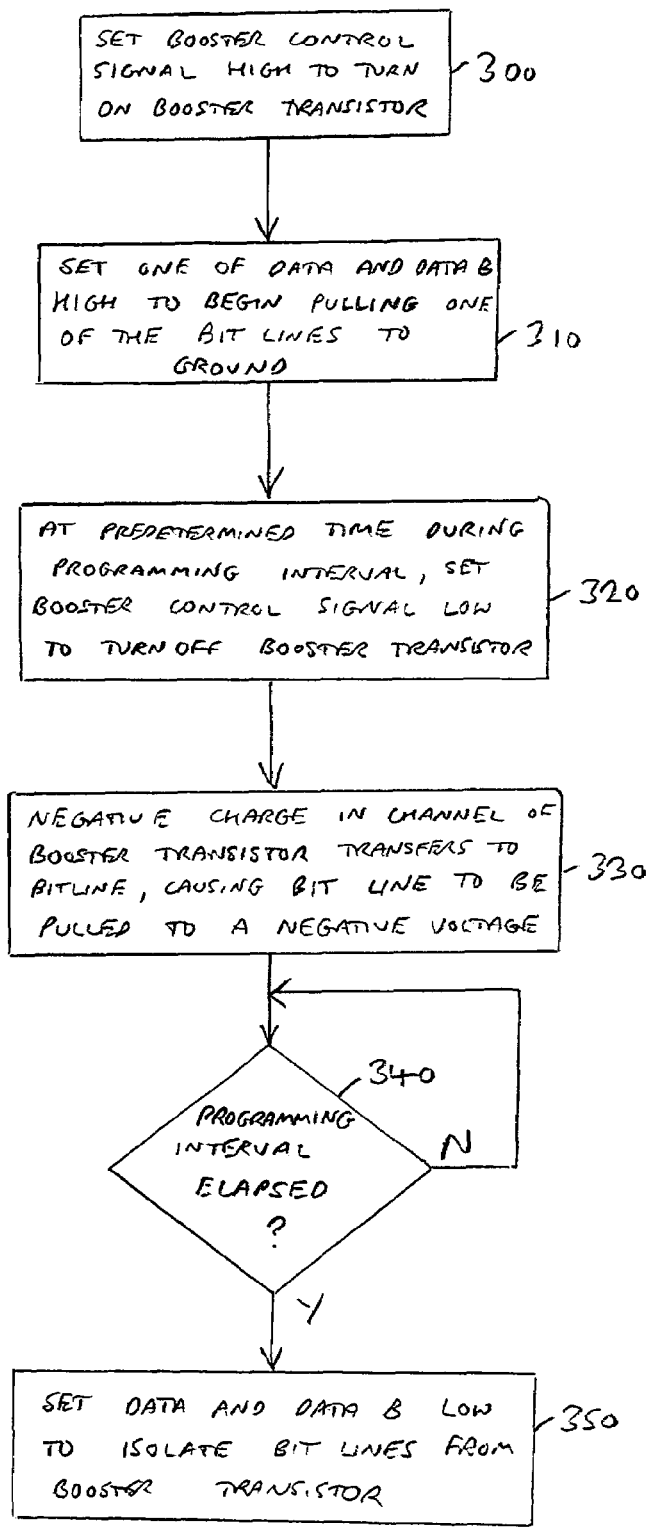
FIG. 4 is a flow diagram illustrating the write operation performed using the write driver circuitry of FIG. 2 in accordance with one embodiment of the present invention.

Considering now FIG. 2, this problem is alleviated in embodiments of the present invention through the provision of the novel write driver circuitry illustrated in FIG. 2. FIG. 2 shows a column of memory cells 100, 110, 120, connected to a pair of bit lines 130, 140. The write driver circuitry includes first coupling circuitry in the form of NMOS coupling transistors 150, 160 which receive respective control signals Data and Datab at their gates. At any point when a write operation is not taking place, both the Data and Datab signals are at a logic zero level, such that the coupling transistors 150 and 160 are turned off. However, during a write operation, one of the Data and Datab signals will be asserted at a logic one level to turn one of the coupling transistors 150, 160 on. In a typical prior art system, this would cause the bit line associated with the coupling transistor that had been turned on to be discharged towards ground potential. However, in accordance with embodiments of the present invention, a further booster transistor 170 is coupled between the first coupling circuitry and ground potential. The operation of this modified write driver circuitry will now be discussed in more detail with reference to FIG. 4.

Prior to the programming interval starting, or at least by the time the programming interval starts, step 300 is performed, whereby a booster control signal provided to the gate of the booster transistor 170 is set high in order to turn the booster transistor 170 on. Accordingly, at this time the source of both the coupling transistor 150 and the coupling transistor 160 are effectively connected to ground through the booster transistor 170. When the write operation begins, then at step 310 one of the Data and Datab signals is set high to turn on the respective coupling transistor 150, 160, thereby causing the associated bit line to begin to be pulled towards ground potential.

At a predetermined time during the programming interval, the booster control signal provided to the gate of the booster transistors 170 is then set to a low level to turn off the booster transistor. The time at which this is done can vary dependent on embodiment. However, in one embodiment this takes place when the voltage on the low going bit line has been reduced to ground potential.

As a result of turning off the booster transistor 170 at step 320, the negative charge in the channel of the booster transistor 170 transfers to the low going bit line, causing that bit line to be pulled to a negative voltage at step 330. By pulling the bit line to a negative potential, this reduces the threshold voltage of the relevant access transistor 260, 270 coupled to that bit line, and also overdrives the PMOS transistor forming the latch within the memory cell. Hence, returning to FIG. 3, if node 240 is initially at the supply voltage level, and during the programming interval the bit line 130 is pulled to the negative potential, this reduces the threshold voltage of the access transistor 260 and overdrives the PMOS transistor 210, thereby providing better writeability of the memory cell.

Returning to FIG. 4, at step 340 it is determined whether the programming interval has elapsed. Typically, the programming interval in any particular embodiment will be set to a predetermined time which is determined to be sufficient for programming of a memory cell to take place, and in particular for that memory cell to reach a steady state during the programming process. Once it has been determined that the programming interval has elapsed, then the Data and Datab signals provided to the coupling transistors 150, 160 are set to a low level to isolate the bit lines from the booster transistor 170. At this point, the programming process has completed. Typically, weak pull up transistors connected to the bit lines (not shown in FIG. 3) will then begin to precharge the bit lines back up to the supply voltage $V_{DD}$.

The size of the NMOS booster transistor 170 can be intelligently tailored dependent on the need of a particular memory design, and in addition this booster transistor can be shared across multiple columns, thereby reducing the impact on area resulting from the provision of such booster transistors 170 within the memory device. A capacitor can also be used in association with, or instead of, the booster transistor if required. It should be noted that the write operation will not be affected by any small variation in timing of the booster control signal.

Figure 5:
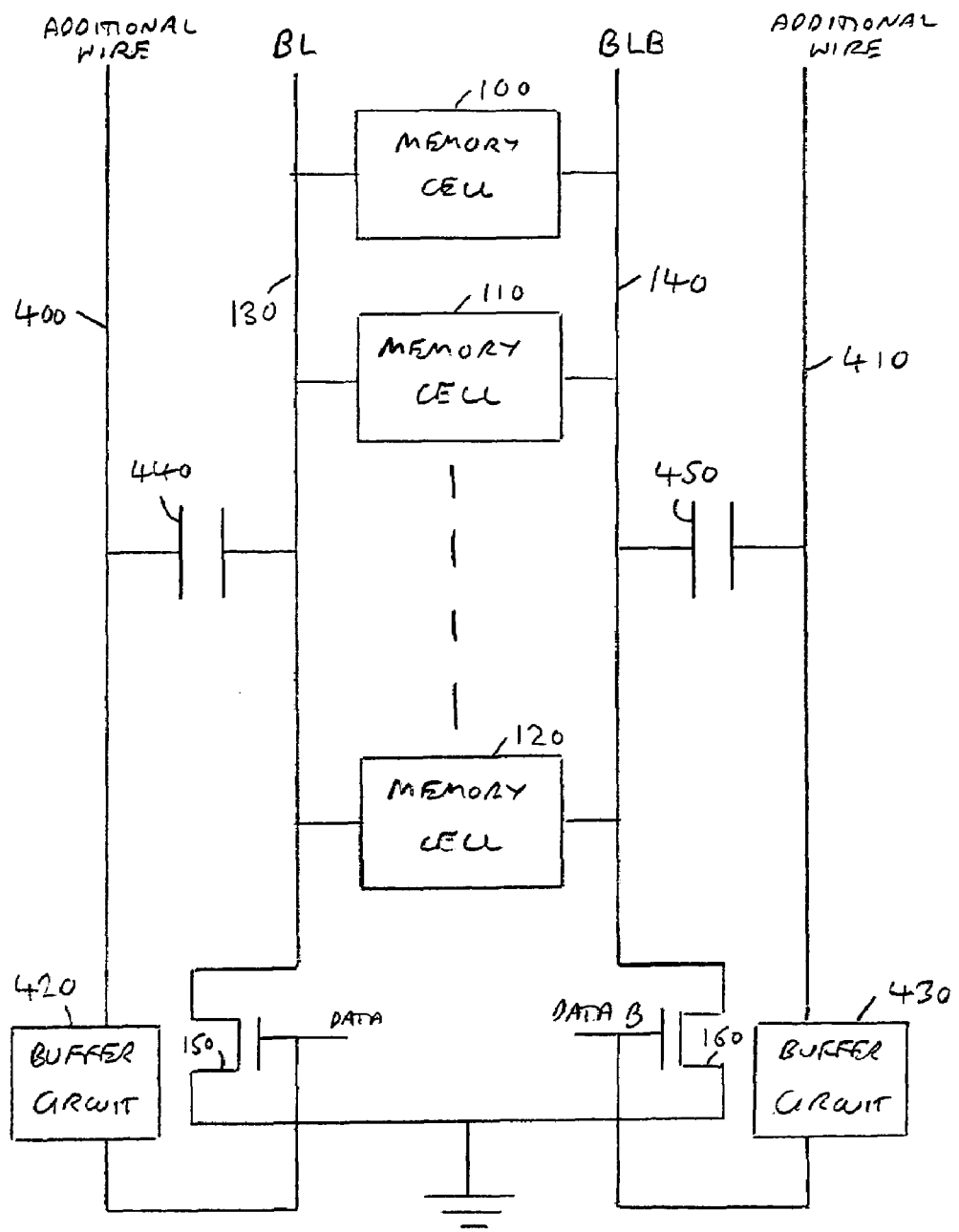
FIG. 5 is a diagram illustrating in more detail the write driver circuitry connected to a pair of bit lines in accordance with an alternative embodiment of the present invention.

FIG. 5 illustrates an alternative embodiment of write driver circuitry, where instead of booster transistors 170, additional wires 400, 410 are provided. More particularly, an additional wire is provided in association with each bit line in the memory array, and each bit line and its associated additional wire are arranged with respect to each other so as to create a capacitance 440, 450 therebetween. Typically, the additional wire 400, 410 will be placed in parallel with the associated bit line 130, 140, and will be placed in close proximity to the associated bit line in order to increase the capacitance.

As can be seen from FIG. 5, buffer circuits 420, 430 are provided in association with each additional wire 400, 410, and at a predetermined time during the programming interval are arranged to alter the potential on the additional wire associated with the low going bit line in order to cause the voltage on the associated bit line to transition to a negative potential. This process will be described in more detail with reference to FIG. 7.

Figure 7:
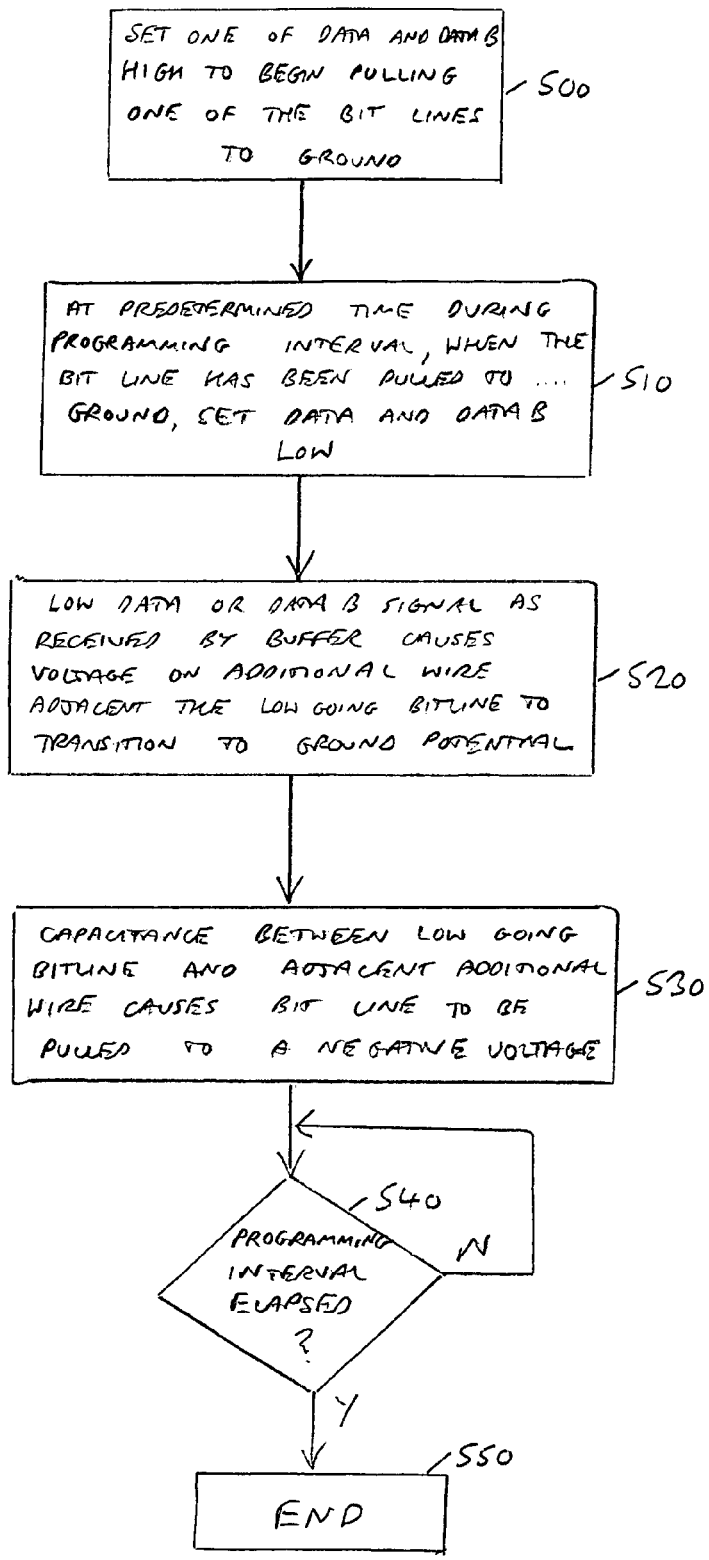
FIG. 7 is a flow diagram illustrating the write operation performed when employing the write driver circuitry of FIG. 5 in accordance with one embodiment of the present invention.

As shown in FIG. 7, at step 500, at the start to of the programming interval, one of the Data and Datab signals is set high to turn on one of the coupling transistors 150, 160 and begin pulling one of the bit lines to ground. Thereafter, at a predetermined time during the programming interval, which will typically be when the relevant bit line has been pulled to the ground level potential, the Data and Datab signals are set low to turn off both of the coupling transistors 150, 160.

Thereafter, at step 520, the low going Data or Datab signal as received by the relevant buffer circuit 420, 430 is used by that buffer circuit to cause the voltage on the additional wire adjacent the low going bit line to transition to ground potential. Prior to this point, the additional wire will have been precharged to the $V_{DD}$ level, and accordingly the discharge of this additional wire towards the ground level potential will cause the adjacent bit line already at the ground potential to be pulled to a negative voltage at step 530 via the capacitance 440, 450 between that low going bit line and the additional wire. The buffer circuits serve to produce a strong drive on the connected additional wires so as to pull those wires down towards ground potential.

Thereafter, at step 540, it is determined whether the programming interval has elapsed, and when the programming interval has elapsed, the process ends at step 550. At this point, programming is complete.

Accordingly, it will be seen that the buffer circuits 420, 430 used in this embodiment function so as to allow the connected additional wire 400, 410 to be precharged to the supply voltage $V_{DD}$, for that additional wire to be kept at that supply voltage until the time at which the Data and Datab signals are set low during the programming interval, and then to cause the additional wire associated with the low going bit line to transition to a logic zero level (this transition being triggered by the associated buffer circuit 420, 430 from the high to low transition of the relevant data or datab signal).

Figure 6:
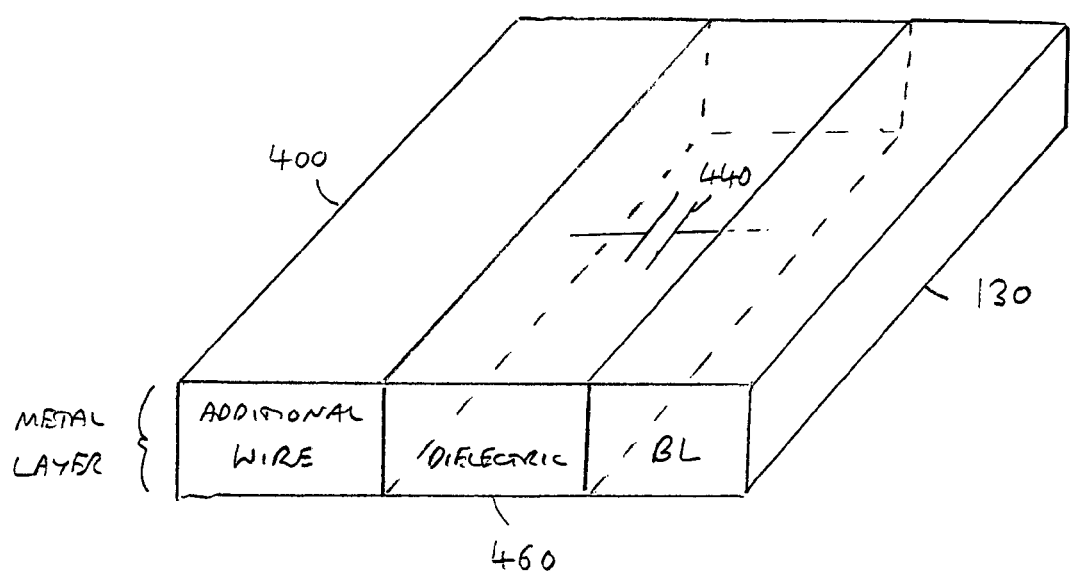
FIG. 6 is a sectional view showing the placement of each additional wire relative to its associated bit line in accordance with one embodiment of the present invention.

FIG. 6 is a diagram showing how in one embodiment the bit line 130 and additional wire 400 are provided in the same metal layer. In such embodiments, the intervening dielectric material 460 serves to form a capacitance 440 between the additional wire 400 and the bit line 130 within the metal layer. Whilst FIG. 6 shows bit line 130 and additional wire 400, it will be appreciated that bit line 140 and additional wire 410 can be constructed in the same manner.

In alternative embodiments, the additional wire 400, 410 may be provided in a different metal layer to the associated bit line 130, 140 provided that a sufficient capacitance can be generated between the additional wires and their associated bit lines.

Figure 8:
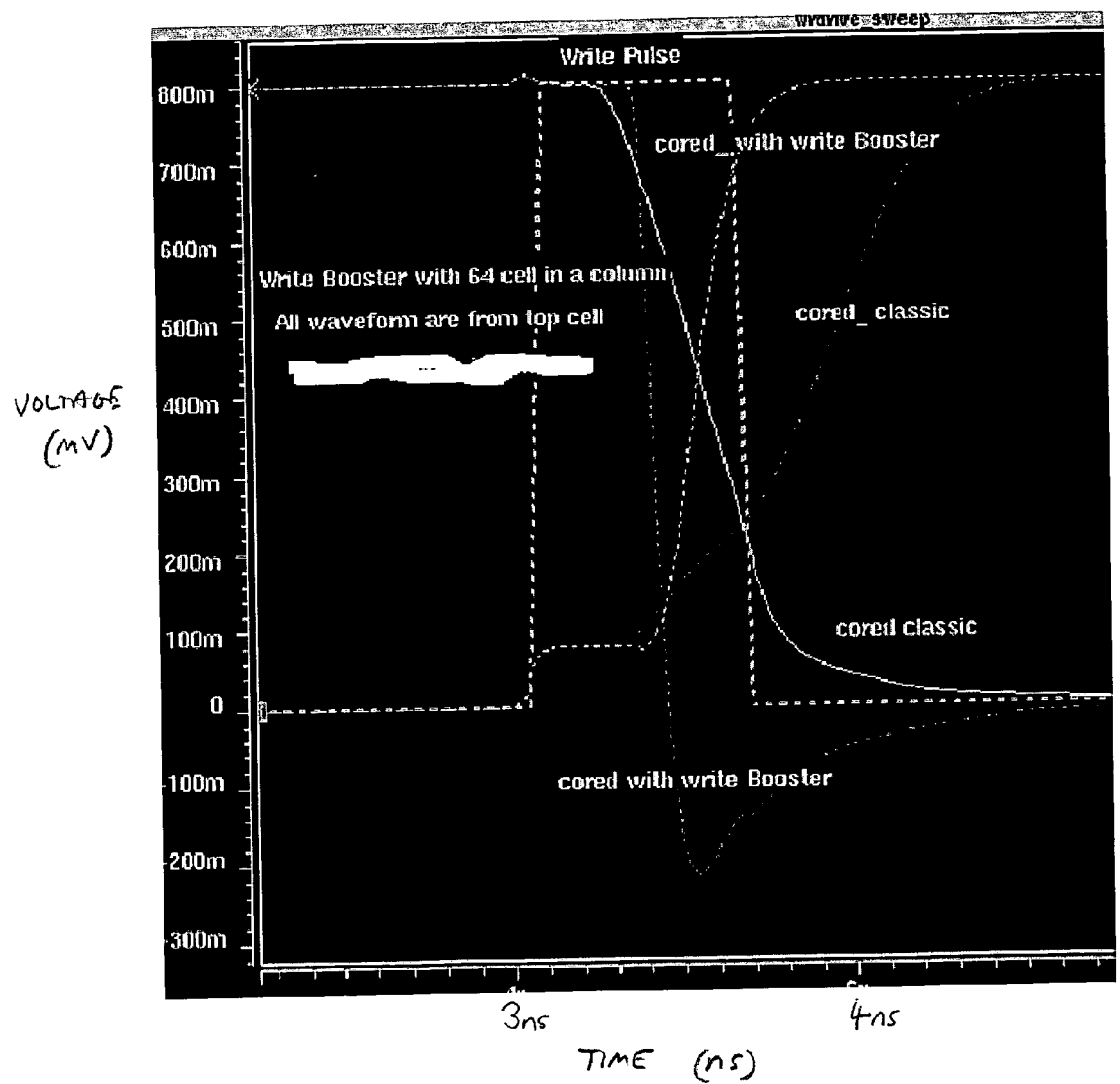
FIG. 8 illustrates a waveform produced when simulating the write operation of a memory device in accordance with one embodiment of the present invention.

FIG. 8 is a waveform diagram illustrating simulation results achieved when comparing write operations within a memory device having standard write driver circuitry and a memory device including the additional booster transistor 170 arrangement shown in FIG. 2. In particular, FIG. 8 shows the simulated results for a column of 64 SRAM cells in an SRAM memory of a memory device conforming to 90 nm technology. The "cored_classic" and "cored_classic" signals are those obtained without the use of the write booster circuitry. The "cored with write booster" and "cored_with write booster" signals are the equivalent signals produced when the write booster circuitry is used. As can be seen, when employing the write booster circuitry, a large improvement in write performance is shown, irrespective of which of the pair of bit lines is being discharged, and accordingly irrespective of which transition in state is taking place. The "cored with write booster" signal is showing a low going transition where the bit line 130 is discharged, and the "cored_with write booster" signal is showing a high going transition where the bit line 140 is discharged.

From the above description of embodiments of the present invention, it will be seen that in accordance with techniques of such embodiments additional coupling circuitry is provided within the write driver circuitry to cause a negative voltage to be applied to the low going bit line, reducing the threshold voltage of the relevant access transistor as well as overdriving the relevant PMOS transistor of the latch, thereby providing better writeability. In the embodiment of FIG. 2, the booster transistor 170 is shareable across multiple columns and hence reduces area overhead. Unlike prior art techniques, the scheme of embodiments of the present invention does not impact on read operation or cell stability.

Variability in device characteristics of the cells in memory devices has become a fundamental problem with CMOS technology which is causing cell stability problems. These problems are aggravated at low voltage and typically to make such a cell stable it has been necessary to compromise on the writeability of the cell. The techniques of the embodiments of the present invention provide improved writeability at low voltage, and accordingly can improve write access speeds in memory devices designed to operate at low voltage.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:
1. A memory device comprising:
a memory array comprising a plurality of memory cells;
a plurality of word lines and a plurality of bit lines via which the plurality of memory cells are accessed;
write driver circuitry responsive to a write request to write data into at least one memory cell during a programming interval by altering voltage on at least one of said bit lines connected to said at least one memory cell whilst one of said word lines connected to said at least one memory cell is selected, to cause a value indicative of the data to be stored in said at least one memory cell;
at a start of the programming interval said at least one bit line being at a first voltage, and the write driver circuitry comprising first coupling circuitry responsive to the write request to couple said at least one bit line to a second voltage to cause the voltage on said at least one bit line to transition towards said second voltage, said first and second voltages representing the operating voltages of said memory cells; and said write driver circuitry further comprising additional coupling circuitry triggered at a predetermined time during said programming interval to cause said at least one bit line to transition beyond said second voltage towards a third voltage.

2. A memory device as claimed in claim 1, wherein said first voltage is a supply voltage, said second voltage is a ground level voltage, and said third voltage is a negative voltage.

3. A memory device as claimed in claim 1, wherein said additional coupling circuitry comprises a booster circuit connected between said first coupling circuitry and said second voltage, at the start of the programming interval the booster circuit connecting said first coupling circuitry to said second voltage, and at said predetermined time said booster circuit being triggered to isolate the first coupling circuitry from the second voltage, charge within the booster circuit causing the at least one bit line to transition beyond said second voltage towards said third voltage.

4. A memory device as claimed in claim 3, wherein the booster circuit is shared amongst bit lines associated with multiple columns of memory cells within the memory array.

5. A memory device as claimed in claim 3, wherein the booster circuit comprises a transistor which is on at the start of the programming interval and is turned off at said predetermined time.

6. A memory device as claimed in claim 1, wherein:

each of said bit lines comprises a metal wire, and said additional coupling circuitry comprises an additional wire associated with each bit line, each bit line and its associated additional wire being arranged with respect to each other so as to create a capacitance therebetween;

at said predetermined time each additional wire associated with said at least one bit line being connected to said second voltage, said capacitance causing the at least one bit line to transition beyond said second voltage towards said third voltage.

7. A memory device as claimed in claim 6, wherein at the start of the programming interval each additional wire associated with said at least one bit line is connected to said first voltage.

8. A memory device as claimed in claim 6, wherein a control signal issued to said first coupling circuitry is further routed to a buffer to cause the buffer to generate at said predetermined time the second voltage placed on said additional wire associated with said at least one bit line.

9. A memory device as claimed in claim 1, wherein each column of memory cells in the memory array is connected to a pair of bit lines, and said write driver circuitry is responsive to a write request to write data into said at least one memory cell by altering the voltage on one of the bit lines in the pair of bit lines associated with each of said at least one memory cell, to cause a value indicative of the data to be stored in said at least one memory cell.

10. A memory device as claimed in claim 9, wherein said first coupling circuitry comprises a pair of transistors for each of said pair of bit lines, at the start of said programming interval one of said pair of transistors being turned on to cause one of the bit lines in said pair of bit lines associated with each of said at least one memory cell to transition towards said second voltage.

11. A method of performing a write operation in a memory device comprising a memory array comprising a plurality of memory cells, and a plurality of word lines and a plurality of bit lines via which the plurality of memory cells are accessed, the method comprising the steps of:

responsive to a write request, writing data into at least one memory cell during a programming interval by selecting one of said word lines connected to said at least one memory cell and altering voltage on at least one of said bit lines connected to said at least one memory cell to cause a value indicative of the data to be stored in said at least one memory cell, said writing step comprising the steps of:

at a start of the programming interval said at least one bit line being at a first voltage, and responsive to the write request employing first coupling circuitry to couple said at least one bit line to a second voltage to cause the voltage on said at least one bit line to transition towards said second voltage, said first and second voltages representing the operating voltages of said memory cells; and at a predetermined time during said programming interval, employing additional coupling circuitry to cause said at least one bit line to transition beyond said second voltage towards a third voltage.

12. A memory device comprising:

memory array means comprising a plurality of memory cell means;

a plurality of word line means and a plurality of bit line means via which the plurality of memory cell means are accessed;

write driver means responsive to a write request for writing data into at least one memory cell means during a programming interval by altering voltage on at least one of said bit line means connected to said at least one memory cell means whilst one of said word line means connected to said at least one memory cell means is selected, to cause a value indicative of the data to be stored in said at least one memory cell means;

at a start of the programming interval said at least one bit line means being at a first voltage, and the write driver means comprising first coupling means responsive to the write request for coupling said at least one bit line means to a second voltage to cause the voltage on said at least one bit line means to transition towards said second voltage, said first and second voltages representing the operating voltages of said memory cell means; and said write driver means further comprising additional coupling means triggered at a predetermined time during said programming interval for causing said at least one bit line means to transition beyond said second voltage towards a third voltage.

* * * * *